United States Patent [19]

Cini et al.

[11] Patent Number: 4,924,296
[45] Date of Patent: May 8, 1990

[54] MULTIPLE-CHIP SEMICONDUCTOR ELEMENT IN A CASE OF METAL AND RESIN

[75] Inventors: Carlo Cini, Cornaredo; Luigi Sisti, Genoa, both of Italy

[73] Assignee: SGS-Thomson Microelectronics SpA, Agrate Brianza, Italy

[21] Appl. No.: 227,539

[22] Filed: Jul. 28, 1988

[30] Foreign Application Priority Data

Jul. 28, 1987 [IT] Italy .................. 21472 A/87

[51] Int. Cl.⁵ .................. H01L 23/28; H01L 23/48
[52] U.S. Cl. .................. 357/72; 357/74; 357/75; 357/80; 357/81
[58] Field of Search .................. 357/72, 74, 75, 80, 357/68, 70, 81

[56] References Cited

U.S. PATENT DOCUMENTS 4,542,401  9/1985  Sekiba .................. 357/81
4,783,428  11/1988  Kalfus .................. 357/81

Primary Examiner—James W. Davie
Attorney, Agent, or Firm—Wenderoth, Lind & Ponack

[57] ABSTRACT

A multiple-chip semiconducting element in a case of metal and resin consists of a metallic plate, a body of synthetic resin which incorporates a portion of the plate, leaving free a larger surface thereof, and a large number of metallic terminals issuing from the same side of the resin body. Inside the resin body, a first semiconductor element chip is affixed to the metallic plate and a second semiconductor element chip is affixed to a metallic lamina made integral with at least one of the terminals and insulated electrically from the plate.

6 Claims, 1 Drawing Sheet

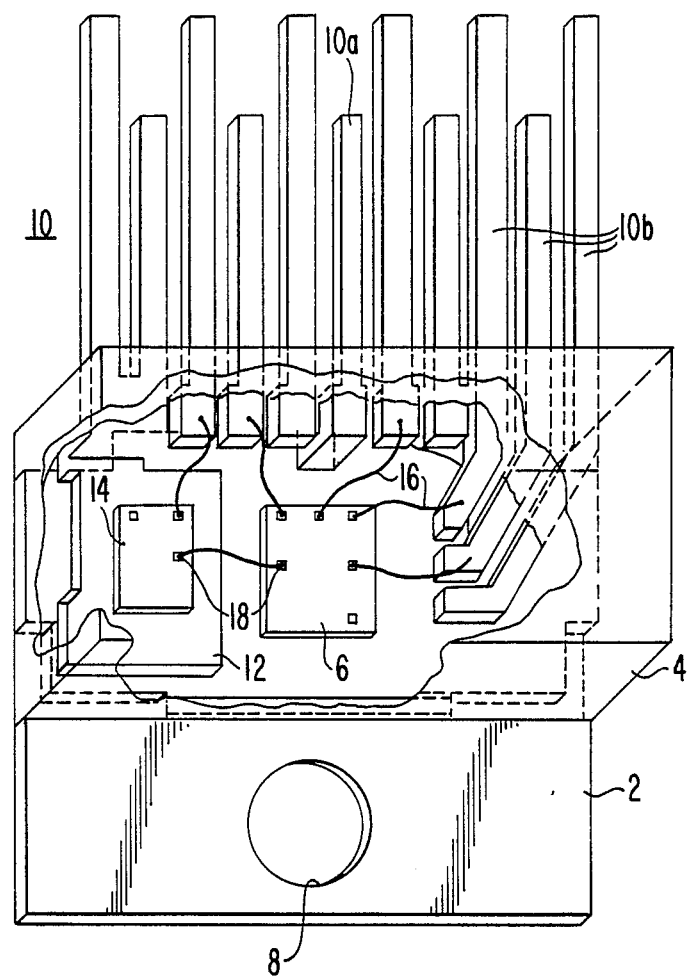

MULTIPLE-CHIP SEMICONDUCTOR ELEMENT IN A CASE OF METAL AND RESIN

BACKGROUND OF THE INVENTION

The present invention relates to semiconductor devices and, more particularly, to those encapsulated in cases with a metallic support and a body of synthetic resin. A case of metal and resin frequently used in the production of integrated power circuits is that known under the name "Multiwatt", which is a registered trademark of the applicant. It includes a metallic plate incorporated in part into a body of synthetic resin in such a way as to leave free a larger surface. A semiconductor element chip, in which an integrated circuit is formed and which constitutes the active part of the device, is affixed to the other larger surface of the plate in intimate thermal contact therewith so as to enable the transmission to the outside, and thereby the dissipation, of heat generated by the semiconductor element chip during the operation thereof. Rigid metal conductors acting as terminals of the device are connected via thin wires to metallized zones of the semiconductor element chip and are in part incorporated into the body of resin and in part protrude therefrom, all aligned along the same side.

In the mass production of devices of this kind, the metallic plates intended for a large number of identical devices are obtained, usually by die cutting, from a relatively thick sheet metal, e.g., copper, and remain joined together in series of 10-20 pieces by means of a tab of sheet metal. Similarly, the rigid metal conductors are obtained, by die cutting or by chemical etching, from a thinner sheet metal, e.g., copper, and remain joined together by transverse metal sections. The strip of the plates and that of the conductors are then joined together, e.g., by some of the rigid conductors that are properly folded and seamed in appropriate notches of the plates; a semiconductor element chip is affixed to each plate, for example by brazing, are welded onto appropriate metallized zones of the chip and onto the conductor tips in order to make appropriate electrical connections between the active element of the device and its terminals. Everything is then inserted into an appropriate mold and into this mold is introduced, by pressure injection, a resin which is in the liquid state, e.g., a thermosetting polymer. After the resin has hardened, the individual devices are separated by die cutting both the tabs that held the plates together and the sections of sheet metal that held the rigid conductors together.

In many cases, the need for increasingly complex circuits capable of coping with increasingly higher powers has forced designers to give up integrating the entire circuit in a single semiconductor element chip in favor of solutions that called for the use of two or more chips. A typical case is that of a circuit having one portion with signal processing functions integrated into a first chip, and one portion with power functions integrated into a second chip. Usually however, circuit users do not want to abandon maximum compactness, that is to say, to have the entire circuit in a single case regardless of the number of chips necessary for its production. However, this forces a person making such devices in many cases to design a new type of case and corresponding costly modifications of the processes of production, or even to create new appropriate lines of production. This proves necessary, especially if the circuit is made of chips in which base electrodes must be insulated from each other.

SUMMARY OF THE INVENTION

The primary object of the present invention is to provide a device having at least two semiconductor element chips with the base electrodes insulated electrically from each other and which are placed in a case of metal and resin having the outward appearance and structure of a standard case of the type described hereinabove and which does not call for important changes of the production process.

This object is achieved by providing a semiconductor device in a case of the type comprising a metallic plate, a body made of synthetic resin which incorporates a portion of said plate, leaving free a larger surface thereof, and a plurality of metallic terminals issuing from one side of said body of synthetic resin, said device comprising inside said body of synthetic resin; a semiconductor element chip affixed to said metallic plate so as to be in electrical contact therewith and connected electrically to at least one of the said plurality of metallic terminals; at least one metallic lamina which is disposed on said metallic plate so as to be separated therefrom by an electrically insulating layer and is made integral with at least one of said plurality of terminals, and another semiconductor element chip affixed to said at least one metallic lamina so as to be in electrical contact therewith.

BRIEF DESCRIPTION OF THE DRAWING

The invention will be better understood by reference to the ensuing detailed description of a preferred embodiment made in conjunction with the accompanying drawing, in which the single FIGURE is an axonometric view of a device incorporating the present invention with the body of resin partially cut away in order to show its internal structure.

DESCRIPTION OF THE PREFERRED EMBODIMENT

As apparent from the drawing FIGURE, a device embodying the present invention is composed of a metallic plate 2 having one portion incorporated into a body of synthetic resin 4. A first semiconductor element chip 6 containing an integrated circuit is affixed to the metallic plate 2, for example, by brazing between the base electrode and the surface of the plate. The plate 2 has a through-hole 8 which serves to affix the device to a suitable external support (heat sink). Numerous rigid metallic conductors or terminals 10 extend, all aligned in the same plane, from one side of plate 2. As is apparent from the drawing, one terminal, designated 10a, is folded at right angles and is inserted into an appropriate notch of the plate 2 so as to be integral therewith. Such a connection, along with those of adjacent devices, serves to hold together the strip of the plates and that of the conductors during the serial assembly of the devices and, particularly, to make an electrical connection between the base electrode of the chip and the exterior of the device. Three terminals, designated 10b, are shaped in such a way as to be located with one of their ends in the proximity of one side of the chip.

According to the present invention, a lamina 12 of sheet metal extends in parallel with plate 2 without entering into contact therewith, and is joined to a least one of the terminals 10 (two in the embodiment shown in the drawing) by means of a connecting part at right angles to the surface of plate 2. Advantageously, lamina 12 can be obtained easily and without modifying the usual production process from the same sheet metal used for the production of terminals 10. Besides the functions of supporting the lamina and acting on electrical conductors between the base electrode of the chip and the outside, the terminals joined to the lamina 12 are useful in the operation of the device, since they contribute to the conduction and dissipation of heat to the exterior of the device.

A second chip 14 containing another integrated circuit or a single power circuit element is affixed, e.g., by brazing, to lamina 12. The metal wires 16 join together metallized zones 18 of the chips or affix them to the tips of terminals 10. Everything, except a part of the terminals 10b, the portion of the plate 2 containing the hole 8, and the entire surface of the plate 2 opposite that containing the chips, is incorporated into the body of synthetic resin 4. During this operation, which is carried out by pressure, a thin layer of resin flows beneath lamina 12, thereby ensuring the electrical insulation between the lamina 12 and the plate 2.

Alternatively, especially if it is desired to considerably reduce the spacing between the lamina and the plate, for which it may be difficult to obtain efficient infiltration of resin, the insulation can be ensured by a layer of material (e.g., a synthetic material), which is electrically insulating and has good thermal conductivity characteristics and which can be interposed between the two parts before the pressure injection operation or the application, in the form of a paint applied directly on the sheet metal of the terminals, before the die cutting operation to produce said terminals.

From the foregoing it can be seen that the device embodying the invention can be made with the same equipment and with the same production processes normally used for the production of devices in standard cases of the "Multiwatt" type and thus lends itself to a very economical mass production.

While only one embodiment of the invention has been illustrated and described, it will be understood that numerous variations and modifications can be made without departing from the scope of the invention. For example, more chips can be welded onto the plate and more laminas can be provided for supporting additional chips insulate from the metallic plate.

We claim:

1. A semiconductor device in a case of the type comprising a metallic plate, a body made of synthetic resin which incorporates a portion of said plate, leaving free a larger surface thereof, and a plurality of metallic terminals issuing from one side of said body of synthetic resin, said device comprising inside said body of synthetic resin; a semiconductor element chip affixed to said metallic plate so as to be in electrical contact therewith and connected electrically to at least one of the said plurality of metallic terminals; at least one metallic lamina disposed on said metallic plate so as to be separated therefrom by an electrically insulating layer and made integral with at least one of said plurality of terminals, and another semiconductor element chip affixed to said at least one metallic lamina so as to be in electrical contact therewith.

2. A semiconductor device as set forth in claim 1, wherein said insulating layer comprises a synthetic material.

3. A semiconductor device as set forth in claim 1, wherein said insulating layer, comprises an electrically insulating material having good thermal conductivity characteristics.

4. A semiconductor device as set forth in claim 1, further comprising electrical interconnecting wires for connecting predetermined zones of said semiconductor element chips.

5. A semiconductor device as set forth in claim 2, further comprising electrical interconnecting wires for connecting predetermined zones of said semiconductor element chips.

6. A semiconductor device as set forth in claim 3, further comprising electrical interconnecting wires for connecting predetermined zones of said semiconductor element chips.

* * * * *